US012690256B2

(12) United States Patent
Huang

(10) Patent No.: US 12,690,256 B2
(45) Date of Patent: Jul. 21, 2026

(54) SEMICONDUCTOR DEVICE WITH CAPPING LAYER AND METHOD FOR FABRICATING THE SAME

(71) Applicant: NANYA TECHNOLOGY CORPORATION, New Taipei City (TW)

(72) Inventor: Tse-Yao Huang, Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 416 days.

(21) Appl. No.: 18/380,930

(22) Filed: Oct. 17, 2023

(65) Prior Publication Data

US 2024/0304697 A1 Sep. 12, 2024

Related U.S. Application Data

(62) Division of application No. 18/119,953, filed on Mar. 10, 2023, now Pat. No. 12,501,686.

(51) Int. Cl.
*H10D 64/66* (2025.01)
*H10D 64/01* (2025.01)
(Continued)

(52) U.S. Cl.
CPC ............ *H10D 64/66* (2025.01); *H10D 64/01* (2025.01); *H10D 64/0113* (2026.01); *H10D 64/01306* (2026.01); *H10D 64/01312* (2026.01); *H10D 64/01314* (2026.01); *H10D 64/661* (2025.01); *H10D 64/664* (2025.01); *H10P 14/418* (2026.01); *H10W 20/056*

(2026.01); *H10W 20/077* (2026.01); *H10W 20/4451* (2026.01); *H10W 20/48* (2026.01); *H10W 74/134* (2026.01); *H10W 74/43* (2026.01); *H10D 64/513* (2025.01); *H10W 20/081* (2026.01); *H10W 20/4462* (2026.01)

(58) Field of Classification Search
CPC ...................... H10D 64/01314; H10D 64/513
See application file for complete search history.

(56) References Cited

U.S. PATENT DOCUMENTS

2006/0118858 A1 6/2006 Jeon et al.
2009/0261420 A1 10/2009 Ryu et al.
(Continued)

OTHER PUBLICATIONS

Office Action and and the search report mailed on Jul. 18, 2025 related to U.S. Appl. No. 18/119,953, wherein this application is a DIV of U.S. Appl. No. 18/119,953.

*Primary Examiner* — Erik Kielin
(74) *Attorney, Agent, or Firm* — Xuan Zhang

(57) ABSTRACT

The present application discloses a semiconductor device and a method for fabricating the semiconductor device. The semiconductor device includes a substrate; a capping mask layer positioned on the substrate; a first gate insulating layer positioned along the capping mask layer, inwardly positioned in the substrate, and having a U-shaped cross-sectional profile; a first work function layer positioned on the first gate insulating layer; a first conductive layer positioned on the first work function layer; and a first capping layer positioned on the first conductive layer. The first capping layer comprises germanium oxide. A top surface of the first capping layer and a top surface of the capping mask layer are substantially coplanar.

5 Claims, 22 Drawing Sheets

(51) Int. Cl.

| | | |
|---|---|---|
| *H10D 64/27* | (2025.01) |
| *H10P 14/40* | (2026.01) |
| *H10W 20/00* | (2026.01) |
| *H10W 20/44* | (2026.01) |
| *H10W 20/48* | (2026.01) |
| *H10W 74/10* | (2026.01) |
| *H10W 74/43* | (2026.01) |

(56) References Cited

U.S. PATENT DOCUMENTS

| | | |
|---|---|---|
| 2019/0067278 A1 | 2/2019 | Seo et al. |
| 2019/0259839 A1 | 8/2019 | Ryu |
| 2020/0066726 A1 | 2/2020 | Fishburn et al. |
| 2020/0152753 A1 | 5/2020 | Huh et al. |
| 2022/0122991 A1* | 4/2022 | Chen ...................... H10B 12/09 |

* cited by examiner

10

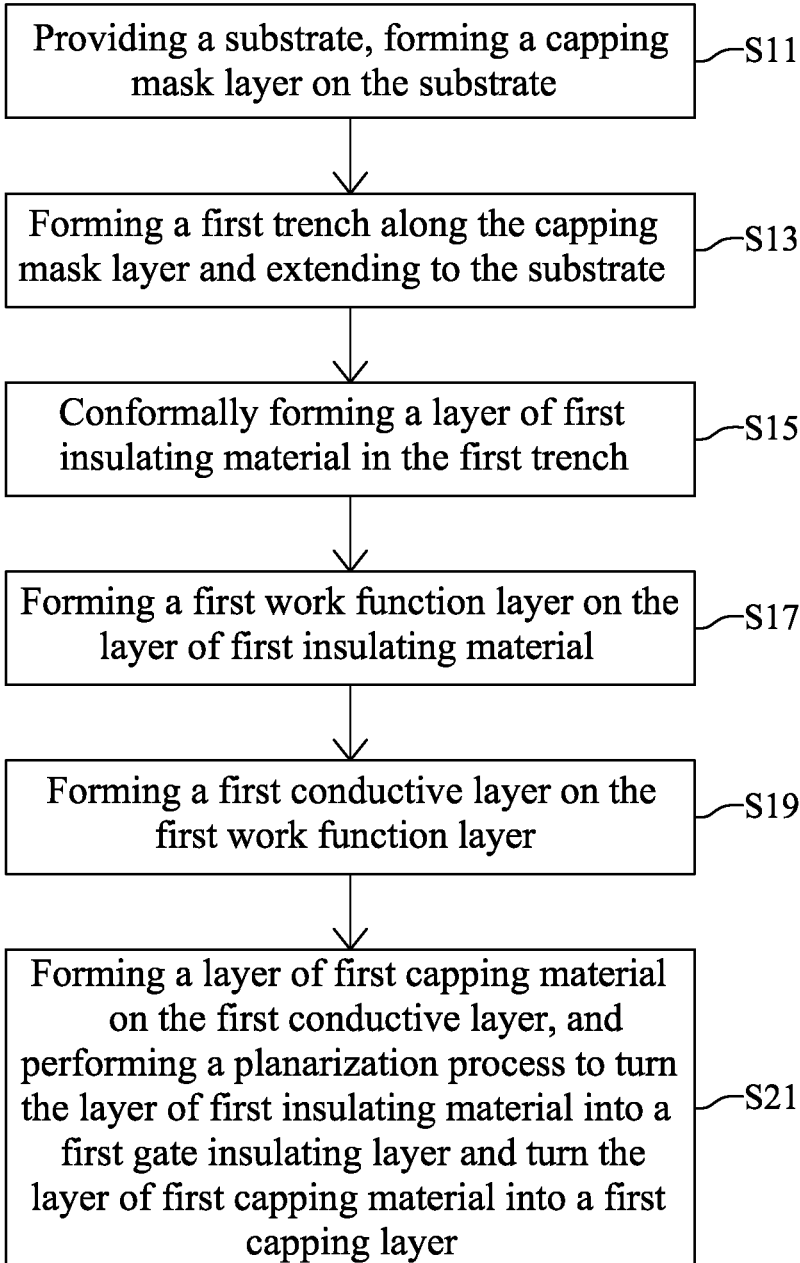

Providing a substrate, forming a capping mask layer on the substrate —S11

Forming a first trench along the capping mask layer and extending to the substrate —S13

Conformally forming a layer of first insulating material in the first trench —S15

Forming a first work function layer on the layer of first insulating material —S17

Forming a first conductive layer on the first work function layer —S19

Forming a layer of first capping material on the first conductive layer, and performing a planarization process to turn the layer of first insulating material into a first gate insulating layer and turn the layer of first capping material into a first capping layer —S21

SEMICONDUCTOR DEVICE WITH CAPPING LAYER AND METHOD FOR FABRICATING THE SAME

CROSS-REFERENCE TO RELATED APPLICATION

This application is a divisional application of U.S. Non-Provisional application Ser. No. 18/119,953 filed Mar. 10, 2023, which is incorporated herein by reference in its entirety.

TECHNICAL FIELD

The present disclosure relates to a semiconductor device and a method for fabricating the semiconductor device, and more particularly, to a semiconductor device with a capping layer and a method for fabricating the semiconductor device with the capping layer.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a capping mask layer positioned on the substrate; a first gate insulating layer positioned along the capping mask layer, inwardly positioned in the substrate, and comprising a U-shaped cross-sectional profile; a first work function layer positioned on the first gate insulating layer; a first conductive layer positioned on the first work function layer; and a first capping layer positioned on the first conductive layer. The first capping layer comprises germanium oxide. A top surface of the first capping layer and a top surface of the capping mask layer are substantially coplanar.

Another aspect of the present disclosure provides a semiconductor device including a substrate; a first dielectric layer positioned on the substrate; a capping mask layer positioned on the first dielectric layer; a first work function layer positioned in the substrate; a first conductive layer positioned on the first work function layer and in the substrate; and a first capping layer positioned along the capping mask layer, extending to the first dielectric layer, and on the first conductive layer. The first capping layer comprises germanium oxide. A top surface of the first capping layer and a top surface of the capping mask layer are substantially coplanar.

Another aspect of the present disclosure provides a method for fabricating a semiconductor device including providing a substrate; forming a capping mask layer on the substrate; forming a first trench along the capping mask layer and extending to the substrate; conformally forming a layer of first insulating material in the first trench; forming a first work function layer on the layer of first insulating material and in the first trench; forming a first conductive layer on the first work function layer and in the first trench; and forming a first capping layer on the first conductive layer. The first capping layer comprises germanium oxide.

Due to the design of the semiconductor device of the present disclosure, the leakage of the semiconductor device may be prevented and the trap density may be decreased by employing the first capping layer formed of germanium oxide. In addition, the resistance of the semiconductor device may be reduced by employing the first conductive layer formed of germanium. As a result, the performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1 illustrates, in a flowchart diagram form, a method for fabricating a semiconductor device in accordance with one embodiment of the present disclosure;

DETAILED DESCRIPTION

Figure 2:
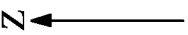
FIGS. 2 to 9 illustrate, in schematic cross-sectional view diagrams, a flow for fabricating the semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 illustrates, in a flowchart diagram form, a method 10 for fabricating a semiconductor device 1A in accordance with one embodiment of the present disclosure. FIGS. 2 to 9 illustrate, in schematic cross-sectional view diagrams, a flow for fabricating the semiconductor device 1A in accordance with one embodiment of the present disclosure.

With reference to FIGS. 1 and 2, at step S11, a substrate 101 may be provided, a capping mask layer 103 may be formed on the substrate 101.

With reference to FIG. 2, in some embodiments, the substrate 101 may include a bulk semiconductor substrate that is composed of at least one semiconductor material. The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 101 may include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and about 200 nm. The insulator layer may eliminate leakage current between adjacent elements in the substrate 101 and reduce parasitic capacitance associated with source/drains.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIG. 2, the capping mask layer 103 may be formed on the substrate 101. In some embodiments, the capping mask layer 103 may be formed of, for example, silicon oxide, undoped silicate glass, fluorosilicate glass, borophosphosilicate glass, a spin-on low-k dielectric layer, a chemical vapor deposition low-k dielectric layer, or a combination thereof. In some embodiments, the capping mask layer 103 may include a self-planarizing material such as a spin-on glass or a spin-on low-k dielectric material such as SiLK™. In some embodiments, the capping mask layer 103 may be formed by a deposition process including, for example, chemical vapor deposition, plasma enhanced chemical vapor deposition, evaporation, or spin-on coating. In some embodiments, the capping mask layer 103 may be formed of, for example, silicon oxide, silicon oxycarbide, silicon oxycarbonitride, silicon oxynitride, silicon nitride oxide, or a combination thereof.

Alternatively, in some embodiments, the capping mask layer 103 may be composed of carbon, hydrogen, and oxygen. In some embodiments, the capping mask layer 103 may be composed of carbon, hydrogen, and fluorine. In some embodiments, the capping mask layer 103 may be a carbon film. The term "carbon film" is used herein to describe materials whose mass is primarily carbon, whose structure is defined primarily by carbon atoms, or whose physical and chemical properties are dominated by its carbon content. The term "carbon film" is meant to exclude materials that are simply mixtures or compounds that include carbon, for example dielectric materials such as carbon-doped silicon oxynitride, carbon-doped silicon oxide or carbon-doped polysilicon.

In some embodiments, the carbon film may include carbon and hydrogen atoms, which may be an adjustable carbon:hydrogen ratio that ranges from about 10% hydrogen to about 60% hydrogen. Controlling the hydrogen ratio of the carbon film may tune the respective etch resistance property and chemical mechanical polishing resistance property. As the hydrogen content decreases, the etch resistance property, and thus the etch selectivity, of the carbon film increases. The reduced rate of removal of the carbon film may make the carbon film suitable for being a mask layer when performing an etch process to transfer the desired pattern onto the underlying layers.

In some embodiments, the capping mask layer 103 may be formed by, for example, chemical vapor deposition, plasma-enhanced chemical vapor deposition, or other applicable deposition processes. In some embodiments, when the capping mask layer 103 is a carbon film, the capping mask layer 103 may be deposited by a process including introducing a processing gas mixture, consisting of one or more hydrocarbon compounds, into a processing chamber. The hydrocarbon compound has a formula CxHy, where x has a range of between 2 and 4 and y has a range of between 2 and 10. The hydrocarbon compounds may be, for example, propylene ($C_3H_6$), propyne ($C_3H_4$), propane ($C_3H_8$), butane ($C_4H_{10}$), butylene ($C_4H_8$), butadiene ($C_4H_6$), acetylene ($C_2H_2$), or a combination thereof.

In some embodiments, the carbon film may be deposited from the processing gas mixture by maintaining a substrate temperature (also referred to as the process temperature for forming the carbon film) between about 100° C. and about 700° C. or between about 350° C. and about 550° C. In some embodiments, the carbon film may be deposited from the processing gas mixture by maintaining a chamber pressure (also referred to as the process pressure for forming the carbon film) between about 1 Torr and about 20 Torr. In some embodiments, the carbon film may be deposited from the processing gas mixture by introducing the hydrocarbon gas, and any inert, or reactive gases respectively, at a flow rate between about 50 sccm and about 2000 sccm.

In some embodiments, the processing gas mixture may further include an inert gas, such as argon. However, other inert gases, such as nitrogen or other noble gases, such as helium may also be used. Inert gases may be used to control the density and deposition rate of the carbon film. Additionally, a variety of gases may be added to the processing gas mixture to modify properties of the carbon film. The gases may be reactive gases, such as hydrogen, ammonia, a mixture of hydrogen and nitrogen, or a combination thereof. The addition of hydrogen or ammonia may be used to control the hydrogen ratio of the carbon film to control layer properties, such as etch selectivity, chemical mechanical polishing resistance property, and reflectivity. In some embodiments, a mixture of reactive gases and inert gases may be added to the processing gas mixture to deposit the carbon film.

Alternatively, in some embodiments, the capping mask layer 103 may be formed of boron carbonitride. In some embodiments, the formation of the capping mask layer 103 may include providing a first precursor to the surface of the substrate 101, generating a capacitively-coupled plasma of the first precursor, and forming the capping mask layer 103.

In some embodiments, the first precursor may include boron, carbon, and/or nitrogen in the precursor. Non-limiting exemplary precursors may be or include tris(dimethylamino)borane, dimethylamine borane, trimethylamine borane, triethylamine borane, tetrakis(dimethylamino)diborane, or any other precursor including one or more of boron, carbon, and/or nitrogen. Additional precursors may be included in some embodiments to adjust atomic ratios. For example, additional hydrogen-containing precursors, carbon-containing precursors such as a hydrocarbon molecule, or nitrogen-containing precursors such as nitrogen gas and ammonia, may be included along with carrier or inert gases, such as helium, neon, argon, krypton, xenon, or nitrogen.

In some embodiments, co-reactants may be included during the formation of the capping mask layer 103. The co-reactants may include carbon dioxide, carbon monoxide, water, methanol, oxygen, ozone, nitrous oxide, and a combination thereof. Such materials may be used as nitriding agents, oxidizers, reductants, etc. In some embodiments, they can be used to tune an amount of carbon in the capping mask layer 103. In some cases, they can be used to tune an amount of nitrogen or oxygen in the capping mask layer 103. In some embodiments, the co-reactants may be introduced along with the first precursor, e.g., without direct exposure to the plasma.

The plasma power at which the process is performed may impact the layer (i.e., the capping mask layer 103) growth, as well as a variety of properties of the layer. For example, carbon incorporation within the layer may allow the dielectric constant to be reduced by incorporating additional methyl groups within the layer. However, during plasma processing, methyl moieties may be decomposed relatively easily, and carbon may then simply be exhausted from the process chamber. Additionally, as plasma power increases, bombardment of the layer may increase, which may remove pores and densify the layer, and which may further increase the dielectric constant of the layer. Accordingly, in some embodiments, the plasma may be generated at a plasma power of less than or about 500 W, and may be generated at less than or about 450 W, less than or about 400 W, less than or about 350 W, less than or about 300 W, less than or about 250 W, less than or about 200 W, less than or about 150 W, less than or about 100 W, less than or about 50 W, or less.

Similarly, the pressure at which the process may be performed may impact aspects of the process as well. For example, as pressure increases, absorption of atmospheric water may increase, which may increase the dielectric constant of the layer. As pressure is maintained lower, hydrophobicity of the layer may increase. Accordingly, in some embodiments the pressure may be maintained at less than or about 10 Torr to afford production of sufficiently low dielectric constant, and the pressure may be maintained at less than or about 9 Torr, less than or about 8 Torr, less than or about 7 Torr, less than or about 6 Torr, less than or about 5 Torr, less than or about 4 Torr, less than or about 3 Torr, less than or about 2 Torr, less than or about 1 Torr, less than or about 0.5 Torr, or less. However, to maintain plasma parameters to facilitate layer formation, the pressure may be maintained above or about 0.5 Torr, and may be maintained above or about 1 Torr, or higher.

In some embodiments, the process temperature during the formation of the capping mask layer 103 may be maintained at a temperature below or about 500° C., and in some embodiments may be maintained at less than or about 475° C., less than or about 450° C., less than or about 425° C., less than or about 400° C., less than or about 375° C., less than or about 350° C., less than or about 325° C., less than or about 300° C., less than or about 275° C., less than or about 250° C., less than or about 225° C., less than or about 200° C., less than or about 175° C., less than or about 150° C., less than or about 125° C., less than or about 100° C., less than or about 75° C., or less.

In some embodiments, the boron concentration of the capping mask layer 103 may be greater than or about 30%, and may be greater than or about 32%, greater than or about 34%, greater than or about 36%, greater than or about 38%, greater than or about 40%, greater than or about 42%, greater than or about 44%, greater than or about 46%, or more. Similarly, the carbon concentration of the capping mask layer 103 may be greater than or about 12%, and may be greater than or about 14%, greater than or about 16%, greater than or about 18%, greater than or about 20%, greater than or about 22%, greater than or about 24%, greater than or about 26%, greater than or about 28%, greater than or about 30%, or more. The nitrogen concentration of the capping mask layer 103 may be greater than or about 20%, and may be greater than or about 22%, greater than or about 24%, greater than or about 26%, greater than or about 28%, greater than or about 30%, greater than or about 32%, greater than or about 34%, greater than or about 36%, greater than or about 38%, or more. Once exposed to atmosphere, the capping mask layer 103 may include any amount of oxygen incorporation, which may be maintained at less than or about 15%, and may be maintained at less than or about 14%, less than or about 13%, less than or about 12%, less than or about 11%, less than or about 10%, less than or about 9%, less than or about 8%, or less.

While carbon or methyl groups may facilitate lower dielectric constant within the capping mask layer 103, a boron-to-nitrogen ratio within the film may affect the layer hardness and modulus. Accordingly, in some embodiments, the boron-to-nitrogen ratio may be maintained at greater than or about 1:1, and may be maintained at greater than or about 1.2:1, greater than or about 1.4:1, greater than or about 1.6:1, greater than or about 1.8:1, greater than or about 2:1, or higher. The carbon-to-boron ratio may also facilitate the beneficial properties of the layer of filling material 505. For example, carbon incorporation may detrimentally impact layer hardness in a general sense, although when sufficiently bonded with boron based on the layer growth characteristics, hardness and modulus may be improved.

In some embodiments, the dielectric constant of the capping mask layer 103 may be less than or about 4.0, less than or about 3.9, less than or about 3.8, less than or about 3.7, less than or about 3.6, less than or about 3.5, less than or about 3.4, less than or about 3.3, less than or about 3.2, less than or about 3.1, less than or about 3.0, less than or about 2.9, less than or about 2.8, or less.

In some embodiments, the Young's modulus of the capping mask layer 103 may be maintained at greater than or about 40 GPa, and may be maintained at greater than or about 42 GPa, greater than or about 44 GPa, greater than or about 46 GPa, greater than or about 48 GPa, greater than or about 50 GPa, greater than or about 52 GPa, greater than or about 54 GPa, greater than or about 56 GPa, greater than or about 58 GPa, greater than or about 60 GPa, greater than or about 62 GPa, or higher. In some embodiments, the layer hardness of the capping mask layer 103 may be maintained at greater than or about 4.0 GPa, and may be maintained at greater than or about 4.1 GPa, greater than or about 4.2 GPa, greater than or about 4.3 GPa, greater than or about 4.4 GPa, greater than or about 4.5 GPa, greater than or about 4.6 GPa, greater than or about 4.7 GPa, greater than or about 4.8 GPa, or higher. These properties may be produced without additional treatment, such as UV or other processes.

With reference to FIG. 2, the first mask layer 501 may be formed on the capping mask layer 103. The first mask layer 501 may be a photoresist layer.

Figure 3:
Figure 4:
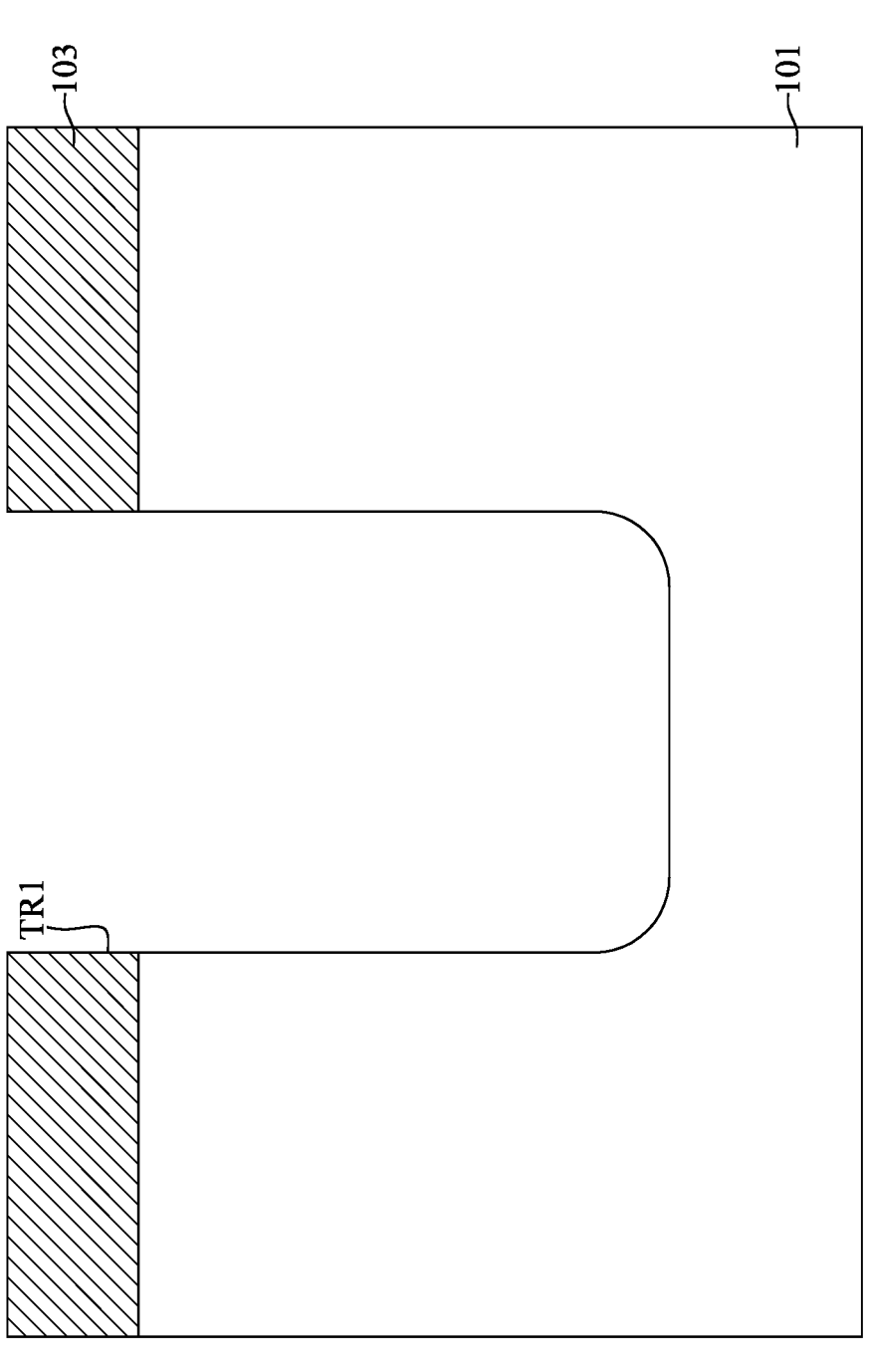

With reference to FIGS. 1, 3, and 4, at step S13, a first trench TR1 may be formed along the capping mask layer 103 and extending to the substrate 101.

With reference to FIG. 3, a cap etching process may be performed to remove portions of the capping mask layer 103 and transfer the pattern of the first mask layer 501 to the capping mask layer 103. In some embodiments, the etch rate ratio of the capping mask layer 103 to the first mask layer 501 may be between about 100:1 and about 1.05:1, between about 15:1 and about 2:1, or between about 10:1 and about 2:1 during the cap etching process. In some embodiments, the etch rate ratio of the capping mask layer 103 to the substrate 101 may be between about 100:1 and about 1.05:1, between about 15:1 and about 2:1, or between about 10:1 and about 2:1 during the cap etching process. After the cap etching process, a first opening OP1 may be formed along the capping mask layer 103. A portion of the substrate 101 may be exposed through the first opening OP1. After the formation of the first opening OP1, the first mask layer 501 may be removed.

With reference to FIG. 4, a first trench etching process may be performed to remove portions of the substrate 101 to extend the first opening OP1 to the substrate 101 and form the first trench TR1. In some embodiments, the etch rate ratio of the substrate 101 to the first capping mask layer 103 may be between about 100:1 and about 1.05:1, between about 15:1 and about 2:1, or between about 10:1 and about 2:1 during the first trench etching process.

Figure 5:
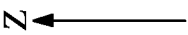

With reference to FIGS. 1 and 5, at step S15, a layer of first insulating material 401 may be conformally formed in the first trench TR1.

With reference to FIG. 5, the layer of first insulating material 401 may be conformally formed in the first trench TR1 and on the top surface 103TS of the capping mask layer 103. In some embodiments, the layer of first insulating material 401 may have a thickness in a range of about 1 nm to about 7 nm, including about 1 nm, about 2 nm, about 3 nm, about 4 nm, about 5 nm, about 6 nm, or about 7 nm.

In some embodiments, the layer of first insulating material 401 may be formed by a thermal oxidation process. For example, the layer of first insulating material 401 may be formed by oxidizing the surface of the first trench TR1. In some embodiments, the layer of first insulating material 401 may be formed by a deposition process such as a chemical vapor deposition or an atomic layer deposition. The layer of first insulating material 401 may include a high-k material, an oxide, a nitride, an oxynitride or combinations thereof. In some embodiments, after a liner polysilicon layer (not shown for clarity) is deposited, the layer of first insulating material 401 may be formed by radical-oxidizing the liner polysilicon layer. In some embodiments, after a liner silicon nitride layer (not shown for clarity) is formed, the layer of first insulating material 401 may be formed by radical-oxidizing the liner silicon nitride layer. In some embodiments, the first insulating material 401 may be, for example, silicon oxide, silicon nitride, silicon oxynitride, silicon nitride oxide, a high-k material, or a combination thereof.

In some embodiments, the high-k material may include a hafnium-containing material. The hafnium-containing material may be, for example, hafnium oxide, hafnium silicon oxide, hafnium silicon oxynitride, or a combination thereof. In some embodiments, the high-k material may be, for example, lanthanum oxide, lanthanum aluminum oxide, zirconium oxide, zirconium silicon oxide, zirconium silicon oxynitride, aluminum oxide or a combination thereof.

Figure 6:
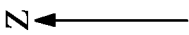

With reference to FIGS. 1 and 6, at step S17, a first work function layer 105 may be formed on the layer of first insulating material 401.

With reference to FIG. 6, the first work function layer 105 may be formed on the layer of first insulating material 401 and in the first trench TR1. The first work function layer 105 may be formed by a deposition process and a subsequent etching back process. The top surface 105TS of the first work function layer 105 may be at a vertical level VL1 lower than the bottom surface 103BS of the capping mask layer 103. In some embodiments, the first work function layer 105 may be formed of, for example, doped polycrystalline silicon, doped polycrystalline germanium, or doped polycrystalline silicon germanium. In some embodiments, the first work function layer 105 may include silicon and/or germanium with substantially no oxygen and nitrogen. As used in this regard, a feature with "substantially no oxygen and nitrogen" has less than 2%, less than 1% or less than 0.5% oxygen and nitrogen on an atomic basis. In some embodiments, the first work function layer 105 may consist essentially of silicon, germanium, or silicon germanium. As used herein, "consists essentially of" with respect to composition of a layer means that the stated elements compose greater than 95%, greater than 98%, greater than 99% or greater than 99.5% of the stated material on an atomic basis. In some embodiments, the first work function layer 105 may be formed of a material having etching selectivity to the capping mask layer 103.

Figure 7:
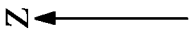

With reference to FIGS. 1 and 7, at step S19, a first conductive layer 107 may be formed on the first work function layer 105.

With reference to FIG. 7, the first conductive layer 107 may be formed on the first work function layer 105 and in the first trench TR1. Detailedly, the first conductive layer 107 may be selectively deposited on the first work function layer 105 over the layer of first insulating material 401 or the capping mask layer 103. In some embodiments, the first conductive layer 107 may be formed of, for example, germanium. In some embodiments, the first conductive layer 107 may include an atomic percentage of germanium greater than or equal to 50%. In this regard, the first conductive layer 107 may be described as a "germanium-rich layer". In some embodiments, the atomic percentage of germanium in the first conductive layer 107 may be greater than or equal to 60%, greater than or equal to 70%, greater than or equal to 80% greater than or equal to 90%, greater than or equal to 95%, greater than or equal to 98%, greater than or equal to 99% or greater than or equal to 99.5%. Stated differently, in some embodiments, the first conductive layer 107 consists essentially of germanium.

In some embodiments, the first conductive layer 107 may be formed by a deposition process. In some embodiments, the deposition process may include a reactive gas including a germanium precursor and/or hydrogen gas. In some embodiments, the germanium precursor may consist essentially of germane. In some embodiments, the germanium precursor may include one or more of germane, digermane, isobutylgermane, chlorogermane, or dichlorogermane. In some embodiments, the hydrogen gas may be used as a carrier or diluent for the germanium precursor. In some embodiments, the reactive gas may consist essentially of germane and hydrogen gas. In some embodiments, the molar percentage of germane in the reactive gas may be in a range of about 1% to about 50%, in a range of about 2% to about 30%, or in a range of about 5% to about 20%.

In some embodiments, the temperature of the intermediate semiconductor device to be deposited may be maintained during the deposition process. The temperature may be referred to as the substrate temperature. In some embodiments, the substrate temperature may be in a range between about 300° C. and about 800° C., between about 400° C. and about 800° C., between about 500° C. and about 800° C., between about 250° C. and about 600° C., between about 400° C. and about 600° C., or between about 500° C. and about 600° C. In some embodiments, the substrate temperature may be about 540° C.

In some embodiments, the pressure of the processing chamber for depositing the first conductive layer 107 may be maintained during the deposition process. In some embodiments, the pressure is maintained in a range between about 1 Torr and about 300 Torr, between about 10 Torr and about 300 Torr, between about 50 Torr and about 300 Torr, between about 100 Torr and 300 Torr, between about 200 Torr and about 300 Torr, or between about 1 Torr and about 20 Torr. In some embodiments, the pressure may be maintained at about 13 Torr.

In some embodiments, the selectivity of the deposition may be greater than or equal to 5, greater than or equal to 10, greater than or equal to 20, greater than or equal to 30, or greater than or equal to 50.

It should be noted that, in the description of the present disclosure, the term "selectively depositing a layer on a first feature over a second feature", and the like, means that a first amount of the layer is deposited on the first feature and a second amount of the layer is deposited on the second feature, where the first amount of the layer is greater than the second amount of the layer, or no layer is deposited on the second feature. The selectivity of a deposition process may be expressed as a multiple of growth rate. For example, if one surface is deposited on twenty-five times faster than a different surface, the process would be described as having a selectivity of 25:1 or simply 25. In this regard, higher ratios indicate more selective deposition processes.

The term "over" used in this regard does not imply a physical orientation of one feature on top of another feature, rather a relationship of the thermodynamic or kinetic properties of the chemical reaction with one feature relative to the other feature. For example, selectively depositing a germanium layer onto a silicon surface over a dielectric surface means that the germanium layer deposits on the metal surface and less or no germanium layer deposits on the dielectric surface; or that the formation of a germanium layer on the silicon surface is thermodynamically or kinetically favorable relative to the formation of a germanium layer on the dielectric surface.

In some embodiments, a pre-cleaning process such as wet etch or dry etch may be performed to remove contaminants before the formation of the first conductive layer 107. In some embodiments, the wet etch process may utilize ammonia or hydrogen fluoride solution. In some embodiments, the dry etch process may be a plasma etch process and may utilize a fluorine or hydrogen containing etchant. The pre-cleaning process would not substantially remove any portion of the first work function layer 105.

In some embodiments, an implantation process may be optionally performed to the first conductive layer 107. The implantation process may employ n-type dopants or p-type of dopants. The n-type dopants may include but are not limited to antimony, arsenic, and/or phosphorus. The p-type dopants may include, but are not limited to, boron, aluminum, gallium and/or indium.

In some embodiments, an annealing process may be performed to activate the first conductive layer 107. The annealing process may have a process temperature between about 800° C. and about 1250° C. The annealing process may have a process duration between about 1 millisecond and about 500 milliseconds. The annealing process may be, for example, a rapid thermal annealing, a laser spike annealing, or a flash lamp annealing.

With reference to FIG. 7, the top surface 107TS of the first conductive layer 107 may be at a vertical level VL2 lower than the bottom surface 103BS of the capping mask layer 103. In some embodiments, the thickness T2 of the first conductive layer 107 and the thickness T1 of the first work function layer 105 may be substantially the same. In some embodiments, the thickness T2 of the first conductive layer 107 and the thickness T1 of the first work function layer 105 may be different.

Figure 8:
Figure 9:

With reference to FIGS. 1, 8, and 9, at step S21, a layer of first capping material 403 may be formed on the first conductive layer 107, and a planarization process may be performed to turn the layer of first insulating material 401 into a first gate insulating layer 115 and turn the layer of first capping material 403 into a first capping layer 109.

With reference to FIG. 8, the layer of first capping material 403 may be formed on the first conductive layer 107, on the layer of first insulating material 401, and completely filling the first trench TR1. In some embodiments, the first capping material 403 may be a material having etching selectivity to the capping mask layer 103. In some embodiments, the first capping material 403 may be a material having etching selectivity to the first insulating material 401. In some embodiments, the first capping material 403 may be, for example, germanium oxide. In some embodiments, the layer of first capping material 403 may be formed by, for example, chemical vapor deposition, atomic layer deposition, or other applicable deposition position.

For example, when the layer of first capping material 403 is formed by atomic layer deposition, the atomic layer deposition process may include alternately and sequentially contacting the intermediate semiconductor device illustrated in FIG. 7 with a vapor phase germanium precursor and an oxygen-containing reactant (also referred to as the oxygen source), such that a layer of the germanium precursor forms on the surface of the intermediate semiconductor device, and the oxygen-containing reactant subsequently reacts with the germanium precursor to form the layer of first capping material 403.

Detailedly, the germanium precursor may be conducted into the process chamber containing the intermediate semiconductor device illustrated in FIG. 7 in the form of vapor phase pulse and contacted with the surface of the intermediate semiconductor device. The excess germanium precursor and reaction byproducts, if any, may be removed from the intermediate semiconductor device and the surface of the intermediate semiconductor device and from proximity to the intermediate semiconductor device and the surface of the intermediate semiconductor device. In some embodiments, the excess germanium precursor and reaction byproducts, if any, may be removed by purging. Purging may be accomplished for example, with a pulse of inert gas such as nitrogen or argon. Purging the process chamber means that vapor phase precursors and/or vapor phase byproducts are removed from the process chamber such as by evacuating the process chamber with a vacuum pump and/or by replacing the gas inside the process chamber with an inert gas such as argon or nitrogen. In some embodiments, the purging times may be between about 0.05 seconds and about 20 seconds, between about 1 second and about 10 seconds, or between about 1 second and about 20 seconds.

The gaseous oxygen source may be pulsed into the process chamber where it reacts with the germanium precursor on the surface of the intermediate semiconductor device to form the layer of first capping material 403 formed of germanium oxide. Excess oxygen source and gaseous by-products of the surface reaction may be removed from the intermediate semiconductor device, for example by purging them out of the process chamber with the aid of an inert gas.

The steps of pulsing and removing may be repeated until the desired thickness has been formed on the intermediate semiconductor device.

In some embodiments, the germanium precursor is not a halide. In some embodiments, the germanium precursor may include a halogen in at least one ligand, but not in all ligands. In some embodiments, the germanium precursor may include germanium ethoxide or tetrakis(dimethylamino) germanium.

In some embodiments, the oxygen source may be water, ozone, oxygen plasma, oxygen radicals, or oxygen atoms. In some embodiments, the oxygen source is not water. In some embodiments, the germanium precursor employed in the processes may be solid, liquid, or gaseous material under standard conditions (room temperature and atmospheric pressure), provided that the germanium precursor is in vapor phase before it is conducted into the process chamber and contacted with the intermediate semiconductor device.

It should be noted that, in the depiction of the present disclosure, "pulsing" a vaporized precursor onto a feature means that the precursor vapor is conducted into the process chamber for a limited period of time. In some embodiments, the germanium precursor may be pulsed between about 0.05 seconds and about 10 seconds, between about 0.1 seconds and about 5 seconds, or between about 0.3 seconds and about 3.0 seconds. In some embodiments, the oxygen source may be pulsed between about 0.05 seconds and about 10 seconds, between about 0.1 seconds and about 5 seconds, or between about 0.2 seconds to about 3.0 seconds.

In some embodiments, the oxygen source may be an oxygen-containing gas pulse and can be a mixture of oxygen and inactive gas, such as nitrogen or argon. In some embodiments the oxygen source may be a molecular oxygen-containing gas pulse. The oxygen content of the oxygen-source gas may be between about 10% and about 25%. Thus, one source of oxygen may be air.

In some embodiments, the oxygen source may be molecular oxygen. In some embodiments, the oxygen source may include an activated or excited oxygen species. In some embodiments, the oxygen source may include ozone. In some embodiments, the oxygen source may be pure ozone or a mixture of ozone, molecular oxygen, and another gas, for example an inactive gas such as nitrogen or argon.

Ozone can be produced by an ozone generator, and it may be introduced into the process chamber with the aid of an inert gas, such as nitrogen, or with the aid of oxygen. In some embodiments, ozone may be provided at a concentration between about 5 vol-% and about 40 vol-%, or between about 15 vol-% and about 25 vol-%. In some embodiments, the oxygen source may be oxygen plasma. In some embodiments, ozone or a mixture of ozone and another gas may be pulsed into the process chamber. In some embodiments, ozone may be formed inside the process chamber, for example by conducting oxygen containing gas through an arc. In some embodiments, an oxygen-containing plasma may be formed in the process chamber. In some embodiments, the plasma may be formed upstream of the process chamber in a remote plasma generator and plasma products may be directed to the process chamber to contact the intermediate semiconductor device.

In some embodiments, the oxygen source may be an oxygen source other than water. Thus, water is not provided in those embodiments.

In some embodiments, the temperature of forming the layer of first capping material 403 may be between about 20° C. and about 600° C., between about 100° C. and about 400° C., or between about 150° C. and about 300° C.

In some embodiments, the layer of first capping material 403 is a pure germanium oxide layer. That is, aside from minor impurities no other metal or semi-metal elements are present in the layer of first capping material 403. In some embodiments, the layer of first capping material 403 may include less than 1-at % of metal or semi-metal other than germanium. In some embodiments, the layer of first capping material 403 may include less than about 5-at % of any impurity other than hydrogen, less than about 3-at % of any impurity other than hydrogen, or less than about 1-at % of any impurity other than hydrogen.

Alternatively, in some embodiments, the layer of first capping material 403 may be conformally formed on the first conductive layer 107 and the layer of first insulating material 401 (not shown). A second capping layer (not shown) may be formed on the layer of first capping material 403 and completely fill the first trench TR1. In some embodiments, the second capping layer may be, for example, silicon oxide, silicon nitride, silicon oxynitride, silicon nitride oxide, or other applicable dielectric material.

With reference to FIG. 9, a planarization process may be performed until the top surface 103TS of the capping mask layer 103 is exposed. After the planarization process, the layer of first insulating material 401 may be turned into the first gate insulating layer 115. The remaining first capping material 403 may be referred to as the first capping layer 109. In some embodiments, the planarization process may be an etching process, a chemical mechanical polishing process, or a combination thereof. In some embodiments, the etch rate ratio of the first capping material 403 to the capping mask layer 103 may be between about 100:1 and about 1.05:1, between about 15:1 and about 2:1, or between about 10:1 and about 2:1 during the planarization process.

With reference to FIG. 9, the top surface 115TS of the first gate insulating layer 115 and the top surface 103TS may be substantially coplanar. In some embodiments, the top surface 109TS of the first capping layer 109 and the top surface 103TS of the capping mask layer 103 may be substantially coplanar. In some embodiments, the bottom surface 109BS of the first capping layer 109 may be at the vertical level VL2 lower than the bottom surface 103BS of the capping mask layer 103.

In some embodiments, the first gate insulating layer 115, the first work function layer 105, the first conductive layer 107, and the first capping layer 109 may be configured as a gate structure.

By employing the first capping layer 109 formed of germanium oxide, the leakage of the semiconductor device 1A may be prevented and the trap density may be decreased. In addition, the resistance of the semiconductor device 1A may be reduced by employing the first conductive layer 107 formed of germanium. As a result, the performance of the semiconductor device 1A may be improved.

Figure 10:
FIG. 10 illustrates, in a schematic cross-sectional view diagram, a semiconductor device in accordance with another embodiment of the present disclosure.

FIG. 10 illustrates, in a schematic cross-sectional view diagram, a semiconductor device 1B in accordance with another embodiment of the present disclosure.

With reference to FIG. 10, the semiconductor device 1B may have a structure similar to that illustrated in FIG. 9. The same or similar elements in FIG. 10 as in FIG. 9 have been marked with similar reference numbers and duplicative descriptions have been omitted.

In the semiconductor device 1B, the top surface 115TS of the first gate insulating layer 115 may be at a vertical level VL3 lower than the bottom surface 103BS of the capping mask layer 103. In some embodiments, the top surface 115TS of the first gate insulating layer 115 and the bottom surface 109BS of the first capping layer 109 may be substantially coplanar. In some embodiments, the top surface 115TS of the first gate insulating layer 115 may not be substantially coplanar with the bottom surface 109BS of the first capping layer 109.

Figure 11:
FIG. 11 illustrates, in a schematic cross-sectional view diagram, a semiconductor device in accordance with another embodiment of the present disclosure.

FIG. 11 illustrates, in a schematic cross-sectional view diagram, a semiconductor device 1C in accordance with another embodiment of the present disclosure.

With reference to FIG. 11, the semiconductor device 1C may have a structure similar to that illustrated in FIG. 9. The same or similar elements in FIG. 11 as in FIG. 9 have been marked with similar reference numbers and duplicative descriptions have been omitted.

With reference to FIG. 11, the semiconductor device 1C may include a first liner layer 111 and a second conductive layer 113. The second conductive layer 113 may be conformally disposed on the first conductive layer 107 and the first gate insulating layer 115, and disposed between the first capping layer 109 and the first conductive layer 107. The first liner layer 111 may have a U-shaped cross-sectional profile. The top surface 111TS of the first liner layer 111 may be substantially coplanar with the bottom surface 109BS of the first capping layer 109. The second conductive layer 113 may be disposed between the first capping layer 109 and the first liner layer 111. The top surface 113TS of the second conductive layer 113 and the bottom surface 109BS of the first capping layer 109 may be substantially coplanar.

In some embodiments, the first liner layer 111 may be formed of a material having etching selectivity to the first gate insulating layer 115. In some embodiments, the first liner layer 111 may be formed of a material having etching selectivity to the first conductive layer 107. In some embodiments, the first liner layer 111 may be formed of a material having etching selectivity to the substrate 101. In some embodiments, the first liner layer 111 may be formed of, for example, a material including sp$^2$ hybridized carbon atoms. In some embodiments, the first liner layer 111 may be formed of, for example, a material including carbons having hexagonal crystal structures. In some embodiments, the first liner layer 111 may be formed of, for example, graphene, graphite, or the like.

In some embodiments, the first liner layer 111 may be formed on a catalyst substrate and then transferred onto the first conductive layer 107. The catalyst substrate may include nickel, copper, cobalt, platinum, silver, ruthenium, iridium, palladium, alloy of iron and nickel, alloy of copper and nickel, alloy of nickel and molybdenum, alloy of gold and nickel, and alloy of cobalt and copper.

In some embodiments, the first liner layer 111 may be formed with the assistance of catalysts. The catalysts may be single crystalline metal or polycrystalline metal, binary alloy, or liquid metal. The single crystalline metal or polycrystalline metal may be, for example, nickel, copper, cobalt, platinum, silver, ruthenium, iridium, or palladium. The binary alloy may be, for example, alloy of iron and nickel, alloy of copper and nickel, alloy of nickel and molybdenum, alloy of gold and nickel, and alloy of cobalt and copper. The liquid metal may be, for example, liquid gallium, liquid indium, or liquid copper.

In some embodiments, a catalytic conductive layer (not shown for clarity) may be conformally formed on the first conductive layer 107 and the first gate insulating layer 115. The first liner layer 111 may be formed on the catalytic conductive layer. The catalytic conductive layer may include nickel, copper, cobalt, platinum, silver, ruthenium, iridium, palladium, alloy of iron and nickel, alloy of copper and nickel, alloy of nickel and molybdenum, alloy of gold and nickel, and alloy of cobalt and copper.

In some embodiments, the second conductive layer 113 may be formed of, for example, molybdenum. In some embodiments, the second conductive layer 113 may be formed by a chemical vapor deposition process. For example, the intermediate semiconductor device to be deposited may be exposed to a molybdenum precursor and a reactant. In some embodiments, the reactant may flow continuously and the molybdenum precursor flow to the chamber may be turned on and off.

In some embodiments, the molybdenum precursor may include a molybdenum halide. In some embodiments, the molybdenum halide may include molybdenum fluoride, molybdenum chloride, or combinations thereof. In some embodiments, the molybdenum precursor may be flowed over the intermediate semiconductor device to be deposited using a carrier gas. In some embodiments, the carrier gas may be flowed through an ampoule including the molybdenum precursor. In some embodiments, the carrier gas may be an inert gas. In some embodiments, the inert gas may include one or more of $N_2$, Ar, and He.

In some embodiments, the flow rate of the molybdenum precursor may be in a range of from 100 slm to 1000 slm, from 100 slm to 700 slm, from 100 slm to 400 slm, from 400 slm to 1000 slm, from 400 slm to 700 slm or from 700 slm to 1000 slm. In some embodiments, the duration of the molybdenum precursor may be in a range of from 0.3 seconds to 5 seconds, from 0.3 seconds to 3 seconds, from 0.3 seconds to 1 seconds, from 1 seconds to 5 seconds, from 1 seconds to 3 seconds or from 3 seconds to 5 seconds.

In some embodiments, the intermediate semiconductor device to be deposited may be exposed to a continuous flow or a plurality of pulses of the molybdenum precursor. In some embodiments, the plurality of pulses of the molybdenum precursor may have a wait time in a range of from 0.3 seconds to 30 seconds, from 0.3 seconds to 10 seconds, from 0.3 seconds to 5 seconds, from 0.3 seconds to 1 seconds, from 0.5 seconds to 5 seconds, from 1 seconds to 30 seconds, from 1 seconds to 10 seconds, from 1 seconds to 5 seconds, from 5 seconds to 30 seconds, from 5 seconds to 10 seconds or from 10 seconds to 30 seconds.

In some embodiments, each of the plurality of pulses of the molybdenum precursor may be applied for a time duration in a range of from 0.3 seconds to 5 seconds, from 0.3 seconds to 3 seconds, from 0.3 seconds to 1 seconds, from 1 seconds to 5 seconds, from 1 seconds to 3 seconds or from 3 seconds to 5 seconds. In some embodiments, at least one of the plurality of pulses of the molybdenum precursor may be applied for a time duration in a range of from 0.3 seconds to 5 seconds, from 0.3 seconds to 3 seconds, from 0.3 seconds to 1 seconds, from 1 seconds to 5 seconds, from 1 seconds to 3 seconds or from 3 seconds to 5 seconds.

In some embodiments, the reactant may include an oxidizing agent, a reducing agent, or a combination thereof. In some embodiments, the reactant may include hydrogen, ammonia, silane, polysilane, or a combination thereof. In some embodiments, silane may be selected from one or more of disilane, trisilane, tetrasilane, higher order silanes, and substituted silane. In some embodiments, the reactant may be flowed over the intermediate semiconductor device using a carrier gas. In some embodiments, the carrier gas may be an inert gas. In some embodiments, the inert gas may include one or more of $N_2$, Ar, and He.

In some embodiments, the flow rate of the reactant may be in a range of from 0.5 slm to 15 slm, from 0.5 slm to 10 slm, from 0.5 slm to 5 slm, from 5 slm to 15 slm, from 5 slm to 10 slm or from 10 slm to 15 slm. In some embodiments, the duration of the reactant may be in a range of from 0.5 seconds to 10 seconds, from 0.5 seconds to 5 seconds, from 0.5 seconds to 1 seconds, from 1 seconds to 10 seconds, from 1 seconds to 5 seconds or from 5 seconds to 10 seconds.

In some embodiments, the intermediate semiconductor device to be deposited may be exposed to a continuous flow or a plurality of pulses of the reactant. In some embodiments, the plurality of pulses of the reactant may have a wait time in a range of from 0.3 seconds to 30 seconds, from 0.3 seconds to 10 seconds, from 0.3 seconds to 5 seconds, from 0.3 seconds to 1 seconds, from 0.5 seconds to 5 seconds, from 1 seconds to 30 seconds, from 1 seconds to 10 seconds, from 1 seconds to 5 seconds, from 5 seconds to 30 seconds, from 5 seconds to 10 seconds or from 10 seconds to 30 seconds.

In some embodiments, each of the plurality of pulses of the reactant may be applied for a time duration in a range of from 0.5 seconds to 10 seconds, from 0.5 seconds to 5 seconds, from 0.5 seconds to 1 seconds, from 1 seconds to 10 seconds, from 1 seconds to 5 seconds or from 5 seconds to 10 seconds. In some embodiments, at least one of the plurality of pulses of the reactant may be applied for a time duration in a range of from 0.5 seconds to 10 seconds, from 0.5 seconds to 5 seconds, from 0.5 seconds to 1 seconds, from 1 seconds to 10 seconds, from 1 seconds to 5 seconds or from 5 seconds to 10 seconds.

In some embodiments, the second conductive layer 113 may be formed at a pressure in a range of from 2 Torr to 60 Torr, from 2 Torr to 40 Torr, from 2 Torr to 20 Torr, from 20 Torr to 60 Torr, from 20 Torr to 40 Torr or from 40 Torr to 60 Torr. In some embodiments, the second conductive layer 113 may be formed at a temperature in a range of from 350° C. to 550° C., from 350° C. to 500° C., from 350° C. to 450° C., from 350° C. to 400° C., from 400° C. to 550° C., from 400° C. to 500° C., from 400° C. to 450° C., from 450° C. to 550° C., from 450° C. to 500° C. or from 500° C. to 550° C.

In some embodiments, an optional annealing process may be performed after the formation of the second conductive layer 113. In some embodiments, the annealing process may be performed at a temperature greater than the temperature of forming the layer of second interconnector material 411. In some embodiments, the annealing process may be performed at temperatures in the range of from 100° C. to 550° C., from 100° C. to 450° C., from 100° C. to 350° C., from 100° C. to 250° C., from 200° C. to 550° C., from 200° C. to 450° C., from 200° C. to 350° C., from 300° C. to 550° C., from 300° C. to 450° C. or from 400° C. to 550° C.

In some embodiments, the environment of the annealing process may include one or more of an inert gas (e.g., molecular nitrogen, argon) or a reducing gas (e.g., molecular hydrogen or ammonia).

In some embodiments, the duration of the annealing process may be in the range of from 1 hour to 24 hour, from 1 hour to 20 hour, from 1 hour to 15 hour, from 1 hour to 10 hour, from 1 hour to 5 hour, from 5 hour to 24 hour, from 5 hour to 20 hour, from 5 hour to 15 hour, from 5 hour to 10 hour, from 10 hour to 24 hour, from 10 hour to 20 hour, from 10 hour to 15 hour, from 15 hour to 24 hour, from 15 hour to 20 hour or from 20 hour to 24 hour. The annealing process may increase the density, decrease the resistivity, and/or increase the purity of the second conductive layer 113.

The first liner layer 111 and the second conductive layer 113 may make the semiconductor device 1C have a low resistance. Therefore, the performance of the semiconductor device 1C may be improved.

Figure 12:
FIG. 12 illustrates, in a schematic cross-sectional view diagram, a semiconductor device in accordance with another embodiment of the present disclosure.

FIG. 12 illustrates, in a schematic cross-sectional view diagram, a semiconductor device 1D in accordance with another embodiment of the present disclosure.

With reference to FIG. 12, the semiconductor device 1D may have a structure similar to that illustrated in FIG. 11. The same or similar elements in FIG. 12 as in FIG. 11 have been marked with similar reference numbers and duplicative descriptions have been omitted.

In the semiconductor device 1D, the top surface 115TS of the first gate insulating layer 115 may be at a vertical level VL4 lower than the bottom surface 103BS of the capping mask layer 103. In some embodiments, the top surface 115TS of the first gate insulating layer 115 and the bottom surface 109BS of the first capping layer 109 may be substantially coplanar. In some embodiments, the top surface 115TS of the first gate insulating layer 115 may not be substantially coplanar with the bottom surface 109BS of the first capping layer 109. In some embodiments, the top surface 115TS of the first gate insulating layer 115, the top surface 111TS of the first liner layer 111, and the top surface 113TS of the second conductive layer 113 may be substantially coplanar.

Figure 13:
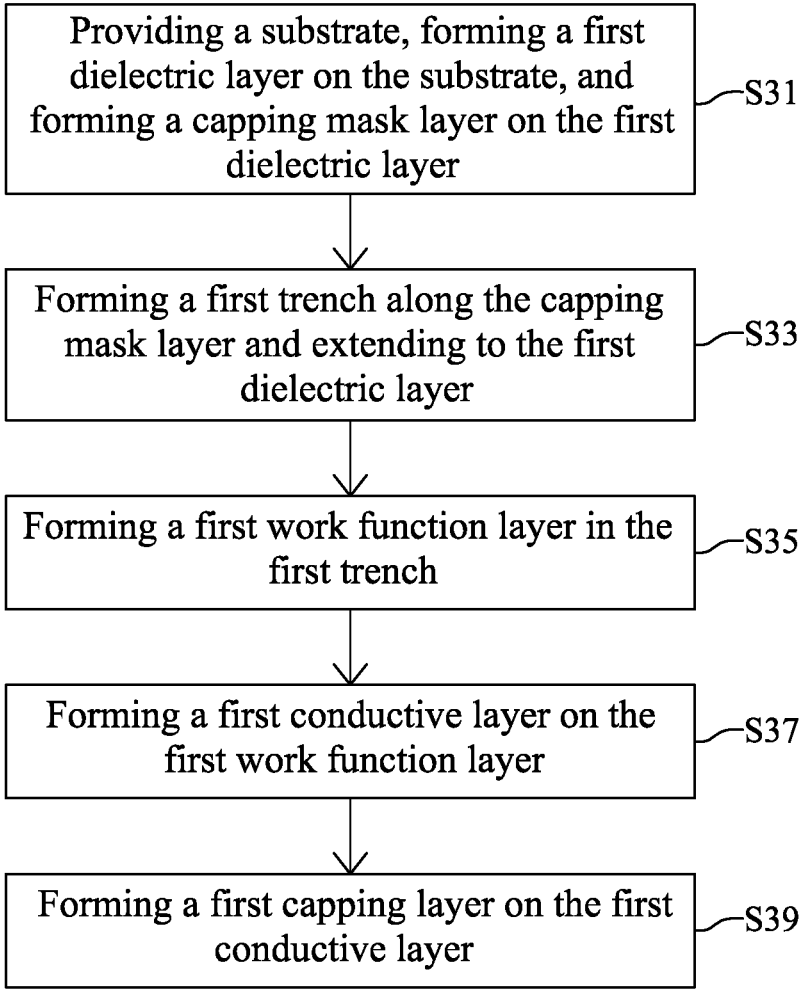
FIG. 13 illustrates, in a flowchart diagram form, a method for fabricating a semiconductor device in accordance with another embodiment of the present disclosure.

FIG. 13 illustrates, in a flowchart diagram form, a method 30 for fabricating a semiconductor device 1E in accordance with another embodiment of the present disclosure. FIGS. 14 to 20 illustrate, in schematic cross-sectional view diagrams, a flow for fabricating the semiconductor device 1E in accordance with another embodiment of the present disclosure.

Figure 14:
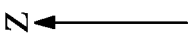
FIGS. 14 to 20 illustrate, in schematic cross-sectional view diagrams, a flow for fabricating the semiconductor device in accordance with another embodiment of the present disclosure.

With reference to FIGS. 13 and 14, at step S31, a substrate 101 may be provided, a first dielectric layer 201 may be formed on the substrate 101, and a capping mask layer 103 may be formed on the first dielectric layer 201.

With reference to FIG. 14, the substrate 101 may include a bulk semiconductor substrate that is composed entirely of at least one semiconductor material, a plurality of device elements (not shown for clarity), a plurality of dielectric layers (not shown for clarity), and a plurality of conductive features (not shown for clarity). The bulk semiconductor substrate may be similar to that illustrated in FIG. 2, and descriptions thereof are not repeated herein.

The plurality of device elements may be formed on the substrate 101. Some portions of the plurality of device elements may be formed in the substrate 101. The plurality of device elements may be transistors such as complementary metal-oxide-semiconductor transistors, metal-oxide-semiconductor field-effect transistors, fin field-effect-transistors, the like, or a combination thereof.

The plurality of dielectric layers may be formed on the substrate 101 and cover the plurality of device elements. In some embodiments, the plurality of dielectric layers may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The plurality of dielectric layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

The plurality of conductive features may include interconnect layers, conductive vias, and conductive pads. The interconnect layers may be separated from each other and may be horizontally disposed in the plurality of dielectric layers along the direction Z. In the present embodiment, the topmost interconnect layers may be designated as the conductive pads. The conductive vias may connect adjacent interconnect layers along the direction Z, adjacent device element and interconnect layer, and adjacent conductive pad and interconnect layer. In some embodiments, the conductive vias may improve heat dissipation and may provide structure support. In some embodiments, the plurality of conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of conductive features may be formed during the formation of the plurality of dielectric layers.

In some embodiments, the plurality of device elements and the plurality of conductive layers may together configure functional units of the semiconductor device 1E. A functional unit, in the description of the present disclosure, generally refers to functionally related circuitry that has been partitioned for functional purposes into a distinct unit. In some embodiments, the functional units of the semiconductor device 1E may include, for example, highly complex circuits such as processor cores, memory controllers, accelerator units, or other applicable functional circuitry.

With reference to FIG. 14, the first dielectric layer 201 may be formed of, for example, for example, silicon oxide, undoped silicate glass, fluorosilicate glass, borophosphosilicate glass, a spin-on low-k dielectric layer, a chemical vapor deposition low-k dielectric layer, or a combination thereof. In some embodiments, the first dielectric layer 201 may include a self-planarizing material such as a spin-on glass or a spin-on low-k dielectric material such as SiLK™. In some embodiments, the first dielectric layer 201 may be formed by a deposition process including, for example, chemical vapor deposition, plasma enhanced chemical vapor deposition, evaporation, or spin-on coating.

With reference to FIG. 14, the capping mask layer 103 may be formed on the first dielectric layer 201. In some embodiments, the capping mask layer 103 may be formed of a material having etching selectivity to the first dielectric layer 201. In some embodiments, the capping mask layer 103 may be formed of a material similar to that illustrated in FIG. 2, and descriptions thereof are not repeated herein.

With reference to FIG. 14, the first mask layer 501 may be formed on the capping mask layer 103. The first mask layer 501 may be a photoresist layer.

Figure 15:
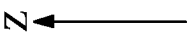
Figure 16:
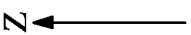

With reference to FIGS. 13, 15, and 16, at step S33, a first trench TR1 may be formed along the capping mask layer 103 and extending to the first dielectric layer 201.

With reference to FIG. 15, a cap etching process may be performed to remove portions of the capping mask layer 103 and transfer the pattern of the first mask layer 501 to the capping mask layer 103. The cap etching process may be performed with a procedure similar to that illustrated in FIG. 3, and descriptions thereof are not repeated herein. After the formation of the first opening OP1, the first mask layer 501 may be removed.

With reference to FIG. 16, a second trench etching process may be performed to remove portions of the first dielectric layer 201 to extend the first opening OP1 to the first dielectric layer 201 and form the first trench TR1. In some embodiments, the etch rate ratio of the first dielectric layer 201 to the first capping mask layer 103 may be between about 100:1 and about 1.05:1, between about 15:1 and about 2:1, or between about 10:1 and about 2:1 during the second trench etching process.

Figure 17:
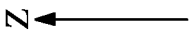

With reference to FIGS. 13 and 17, at step S35, a first work function layer 105 may be formed in the first trench TR1.

With reference to FIG. 17, the first work function layer 105 may be formed in the first trench TR1. The first work function layer 105 may be formed in the first trench TR1 by a deposition process and a subsequent etching back process. The top surface 105TS of the first work function layer 105 may be at a vertical level VL1 lower than the bottom surface 103BS of the capping mask layer 103. In some embodiments, the first work function layer 105 may be formed of, for example, doped polycrystalline silicon, doped polycrystalline germanium, or doped polycrystalline silicon germanium. In some embodiments, the first work function layer 105 may include silicon and/or germanium with substantially no oxygen and nitrogen. As used in this regard, a feature with "substantially no oxygen and nitrogen" has less than 2%, less than 1% or less than 0.5% oxygen and nitrogen on an atomic basis. In some embodiments, the first work function layer 105 may consist essentially of silicon, germanium, or silicon germanium. In some embodiments, the first work function layer 105 may be formed of a material having etching selectivity to the capping mask layer 103.

Figure 18:
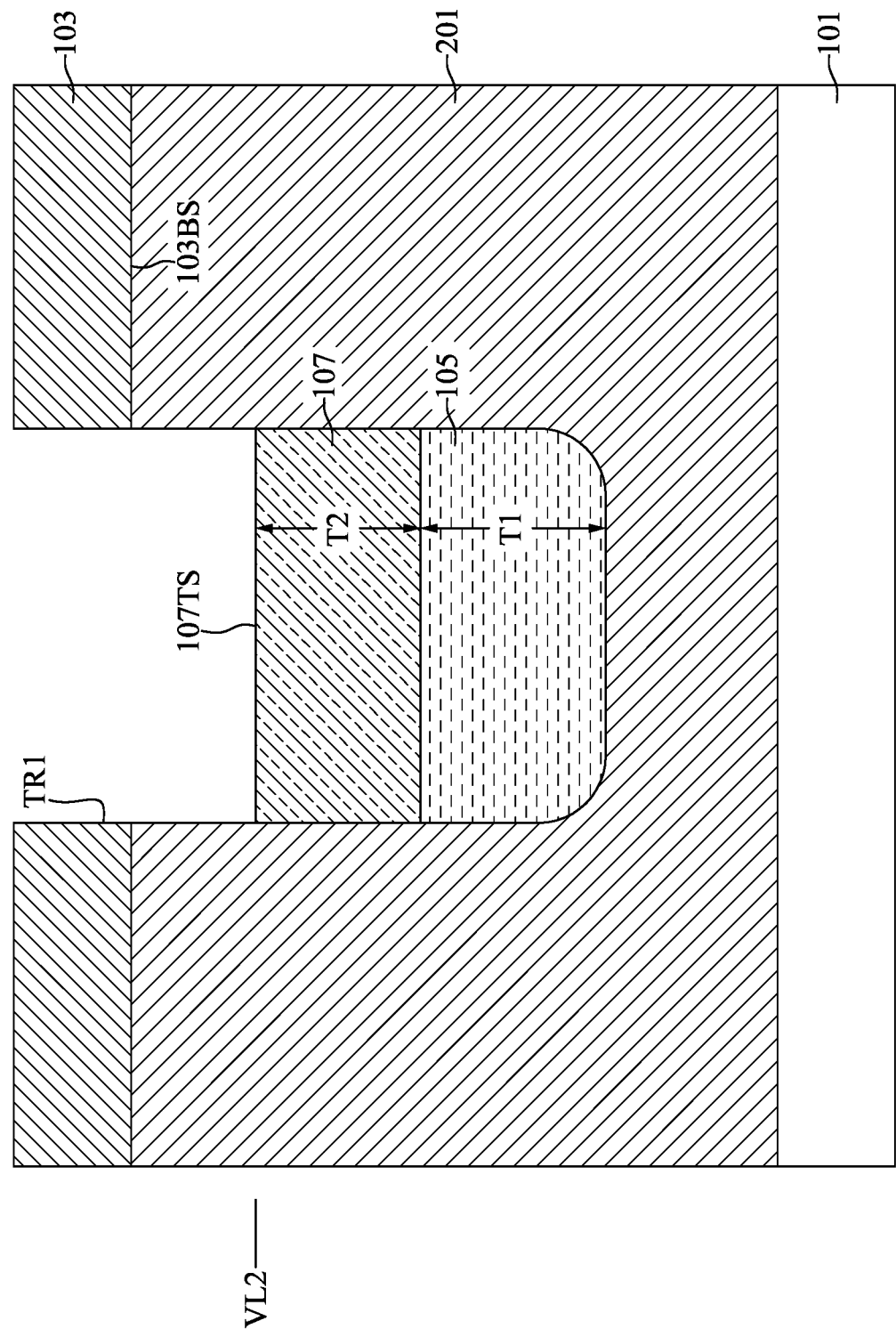

With reference to FIGS. 13 and 18, at step S37, a first conductive layer 107 may be formed on the first work function layer 105.

With reference to FIG. 18, the first conductive layer 107 may be formed on the first work function layer 105 and in the first trench TR1. Detailedly, the first conductive layer 107 may be selectively deposited on the first work function layer 105 over the first dielectric layer 201 or the capping mask layer 103. In some embodiments, the first conductive layer 107 may be formed of, for example, germanium. In some embodiments, the first conductive layer 107 may include an atomic percentage of germanium greater than or equal to 50%. In this regard, the first conductive layer 107 may be described as a "germanium-rich layer". In some embodiments, the atomic percentage of germanium in the first conductive layer 107 may be greater than or equal to 60%, greater than or equal to 70%, greater than or equal to 80% greater than or equal to 90%, greater than or equal to 95%, greater than or equal to 98%, greater than or equal to 99% or greater than or equal to 99.5%. Stated differently, in some embodiments, the first conductive layer 107 consists essentially of germanium. In some embodiments, the selectivity of the deposition may be greater than or equal to 5, greater than or equal to 10, greater than or equal to 20, greater than or equal to 30, or greater than or equal to 50.

The formation of the first conductive layer 107 may be similar to that illustrated in FIG. 7, and descriptions thereof are not repeated herein.

With reference to FIG. 18, the top surface 107TS of the first conductive layer 107 may be at a vertical level VL2 lower than the bottom surface 103BS of the capping mask layer 103. In some embodiments, the thickness T2 of the first conductive layer 107 and the thickness T1 of the first work function layer 105 may be substantially the same. In some embodiments, the thickness T2 of the first conductive layer 107 and the thickness T1 of the first work function layer 105 may be different.

Figure 19:
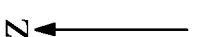
Figure 20:
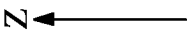

With reference to FIGS. 13, 19, and 20, at step S39, a first capping layer 109 may be formed on the first conductive layer 107.

With reference to FIG. 19, the layer of first capping material 403 may be formed with a procedure similar to that illustrated in FIG. 8, and descriptions thereof are not repeated herein.

With reference to FIG. 20, a planarization process may be performed until the top surface 103TS of the capping mask layer 103 is exposed. After the planarization process, the remaining first capping material 403 may be referred to as the first capping layer 109. In some embodiments, the planarization process may be an etching process, a chemical mechanical polishing process, or a combination thereof. In some embodiments, the etch rate ratio of the first capping material 403 to the capping mask layer 103 may be between about 100:1 and about 1.05:1, between about 15:1 and about 2:1, or between about 10:1 and about 2:1 during the planarization process. In some embodiments, the bottom surface 109BS of the first capping layer 109 may be at a vertical level VL3 lower than the bottom surface 103BS of the capping mask layer 103.

Figure 21:
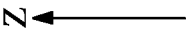
FIG. 21 illustrates, in a schematic cross-sectional view diagram, a semiconductor device in accordance with another embodiment of the present disclosure.

FIG. 21 illustrates, in a schematic cross-sectional view diagram, a semiconductor device 1F in accordance with another embodiment of the present disclosure.

With reference to FIG. 21, the semiconductor device 1F may have a structure similar to that illustrated in FIG. 20. The same or similar elements in FIG. 21 as in FIG. 20 have been marked with similar reference numbers and duplicative descriptions have been omitted.

With reference to FIG. 21, the semiconductor device 1F may include a first liner layer 111 and a second conductive layer 113. The first liner layer 111 and the second conductive layer 113 may be similar to that illustrated in FIG. 11, and descriptions thereof are not repeated herein.

Figure 22:
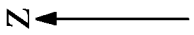
FIG. 22 illustrates, in a schematic cross-sectional view diagram, a semiconductor device 1G in accordance with another embodiment of the present disclosure.

FIG. 22 illustrates, in a schematic cross-sectional view diagram, a semiconductor device 1G in accordance with another embodiment of the present disclosure.

With reference to FIG. 22, the semiconductor device 1G may have a structure similar to that illustrated in FIG. 20. The same or similar elements in FIG. 22 as in FIG. 20 have been marked with similar reference numbers and duplicative descriptions have been omitted.

With reference to FIG. 22, the first trench TR1 may be formed along the first dielectric layer 201. Therefore, the first work function layer 105 and the first conductive layer 107 may electrically connect to the corresponding device element of the substrate 101.

One aspect of the present disclosure provides a semiconductor device including a substrate; a capping mask layer positioned on the substrate; a first gate insulating layer positioned along the capping mask layer, inwardly positioned in the substrate, and comprising a U-shaped cross-sectional profile; a first work function layer positioned on the first gate insulating layer; a first conductive layer positioned on the first work function layer; and a first capping layer positioned on the first conductive layer. The first capping layer comprises germanium oxide. A top surface of the first capping layer and a top surface of the capping mask layer are substantially coplanar.

Another aspect of the present disclosure provides a semiconductor device including a substrate; a first dielectric layer positioned on the substrate; a capping mask layer positioned on the first dielectric layer; a first work function layer positioned in the substrate; a first conductive layer positioned on the first work function layer and in the substrate; and a first capping layer positioned along the capping mask layer, extending to the first dielectric layer, and on the first conductive layer. The first capping layer comprises germanium oxide. A top surface of the first capping layer and a top surface of the capping mask layer are substantially coplanar.

Another aspect of the present disclosure provides a method for fabricating a semiconductor device including providing a substrate; forming a capping mask layer on the substrate; forming a first trench along the capping mask layer and extending to the substrate; conformally forming a layer of first insulating material in the first trench; forming a first work function layer on the layer of first insulating material and in the first trench; forming a first conductive layer on the first work function layer and in the first trench; and forming a first capping layer on the first conductive layer. The first capping layer comprises germanium oxide.

Due to the design of the semiconductor device of the present disclosure, the leakage of the semiconductor device 1A may be prevented and the trap density may be decreased by employing the first capping layer 109 formed of germanium oxide. In addition, the resistance of the semiconductor device 1A may be reduced by employing the first conductive layer 107 formed of germanium. As a result, the performance of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
   providing a substrate;
   forming a capping mask layer on the substrate;
   forming a first trench along the capping mask layer and extending to the substrate;
   conformally forming a layer of first insulating material into the first trench;
   forming a first work function layer on the layer of first insulating material and in the first trench;
   forming a first conductive layer on the first work function layer and in the first trench; and
   forming a first capping layer on the first conductive layer;
   wherein the first capping layer comprises germanium oxide;
   wherein the first conductive layer comprises germanium;
   wherein the first work function layer comprises silicon and/or germanium with substantially no oxygen and nitrogen;
   wherein the first gate insulating layer comprises silicon oxide, silicon nitride, silicon oxynitride, silicon nitride oxide, a high-k material, or a combination thereof;
   wherein the capping mask layer comprises silicon oxide, silicon oxycarbide, silicon oxycarbonitride, silicon oxynitride, silicon nitride oxide, or a combination thereof;
   wherein forming the first capping layer on the first conductive layer comprises:
   alternately and sequentially introducing a germanium precursor and an oxygen source to form a layer of first capping material filling the first trench; and
   performing a planarization process until a top surface of the capping mask layer is exposed to turn the layer of first capping material into the first capping layer.

2. The method for fabricating the semiconductor device of claim 1, wherein the germanium precursor comprises germanium ethoxide or tetrakis (dimethylamino) germanium.

3. The method for fabricating the semiconductor device of claim 2, wherein the oxygen source comprises an activated or excited oxygen species.

4. The method for fabricating the semiconductor device of claim 3, wherein a process temperature of forming the first capping layer is between about 20° C. and about 600° C.

5. The method for fabricating the semiconductor device of claim 4, wherein the planarization process comprises an etching process, a chemical mechanical polishing process, or a combination thereof.

* * * * *